(12) United States Patent
Neffling

(10) Patent No.: US 6,229,391 B1
(45) Date of Patent: May 8, 2001

(54) ADAPTATION METHOD AND AMPLIFIER ARRANGEMENT

(75) Inventor: Toni Neffling, Espoo (FI)

(73) Assignee: Nokia Networks, Oy, Espoo (FI)

(*) Notice: Subject to any disclaimer, the term of this patent is extended or adjusted under 35 U.S.C. 154(b) by 0 days.

(21) Appl. No.: 09/550,186

(22) Filed: Apr. 14, 2000

Related U.S. Application Data

(63) Continuation of application No. PCT/FI98/00836, filed on Oct. 27, 1998.

(30) Foreign Application Priority Data

Oct. 29, 1997 (FI) .................................................. 974087

(51) Int. Cl.[7] .............................. H03F 1/00; H03F 3/66; H04K 1/02
(52) U.S. Cl. .............................. 330/151; 330/52; 375/297
(58) Field of Search .............................. 330/52, 149, 151; 375/297

(56) References Cited

U.S. PATENT DOCUMENTS

| | | | |
|---|---|---|---|
| 3,922,617 | * 11/1975 | Denniston et al. | 330/151 |
| 4,580,105 | 4/1986 | Myer | 330/52 |
| 5,157,345 | 10/1992 | Kenington et al. | 330/149 |
| 5,455,537 | * 10/1995 | Larkin et al. | 330/52 |
| 5,815,036 | * 9/1998 | Yoshikawa et al. | 330/52 |
| 6,066,984 | * 5/2000 | Tomaru et al. | 330/149 |

FOREIGN PATENT DOCUMENTS

| | | |
|---|---|---|
| 2107540 | 4/1983 | (GB). |
| 97/37427 | 10/1997 | (WO). |

OTHER PUBLICATIONS

International Search Report.

* cited by examiner

Primary Examiner—Robert Pascal
Assistant Examiner—Patricia T. Nguyen
(74) Attorney, Agent, or Firm—Altera Law Group, LLC

(57) ABSTRACT

The invention relates to an adaptation method and amplifier arrangement, which comprises feedforward amplifying means (10) which amplify a signal entering the arrangement, and adjusting means (20, 25, 50, 80) which use complex factors $\alpha$ and $\beta$, which are adapted in order to adjust the phase and amplitude of the input signal to the amplifier arrangement. The amplifier arrangement also comprises attenuation means (40) which attenuate the signal amplified by the amplifier (10), means (60) which subtract the attenuated signal from the adapted signal, adjusting means (50, 80) which receive part of the signal entering the arrangement for adaptation by factor a, which is adapted partly by the signal obtained from the adapted signal. Furthermore, the amplifier arrangement comprises means (180) which are connected to the outgoing end of the amplifier (10) and form a predetermined signal, adders (15) which add the predetermined signal to the signal amplified by the amplifying means (10), means (150) which form a conjugate signal of the adapted signal and multiply the conjugate signal by the predetermined signal and control adaptation of factor $\beta$ by means of the signal obtained as a result of multiplication.

17 Claims, 1 Drawing Sheet

ADAPTATION METHOD AND AMPLIFIER ARRANGEMENT

This application is a continuation of PCT/FI98/00836 filed Oct. 27, 1998.

FIELD OF THE INVENTION

The invention relates to an adaptation method used in an amplifier arrangement, the method comprising amplifying a signal entering the arrangement in a feedforward manner, and using complex factors α and β, which are adapted in order to adjust the phase and amplitude of an input signal to the amplifier arrangement.

BACKGROUND OF THE INVENTION

Broadband amplifiers and power amplifiers, in particular, cause distortion to a signal, since the amplifiers function non-linearly at least to some degree. Besides distortion amplifiers cause for example noise. The influence of distortion caused by amplifiers has been reduced by means of feedforward amplifiers.

Usually, the incoming end and outgoing end of feedforward amplifiers have to be adapted to signal paths. Processing of signals always causes some delay to a signal. For this reason adaptation of the delay and gain requires particular accuracy so that the amplifier would function as desired in all operational environments. Prior art amplifiers have been part of an amplifier arrangement which has been provided with signal cancellation loops and error cancellation loops. The amplifier arrangement has adjusted the phase and amplitude of a signal acting on the loops, which has enabled reduction of distortion in the signal. The amplifier arrangement has also been able to adapt to the received signal to some degree.

Special factors, which can be denoted with α and β, are employed for adjusting the phase and amplitude. The factors are changed and adjusted by means of an adaptation factor, which is denoted with K. When the power level of an input signal changes rapidly, α and β also need to change rapidly to correspond to the changed situation. In prior art solutions the same method has been used for adaptating both factors, which has caused problems. Problems have appeared particularly when a pilot signal has been used in adaptation.

A pilot signal, power minimization method and gradient method, for example, have been employed in adapting factors α and β. However, the same method of adapting factors has been used in both cancellation loops, and thus any errors in the factors have been dependent on one another. The prior art methods have also suffered from other problems because the pilot signal has typically been used before signal amplification, in which case the pilot signal has caused noise and therefore it has been necessary to filter the signal out of the output of the amplifier.

BRIEF DESCRIPTION OF THE INVENTION

The object of the invention is to provide an adaptation method and amplifier arrangement which allow to solve the above-mentioned problems. This is achieved with the adaptation method described in the introduction, which is characterized in that complex factor a is adapted by attenuating an amplified signal, by supplying part of a signal entering the arrangement for adaptation, and by controlling adaptation of complex factor α with part of the signal whose phase and amplitude are adapted, by subtracting the attenuated signal from the adapted signal; complex factor β is adapted by forming a predetermined signal, which is added to the amplified signal, by forming a conjugate signal of the adapted signal and by multiplying it by the predetermined signal, by adapting factor β by the signal obtained as a result of multiplication, factor p being used for adapting the phase and amplitude of the formed sum signal.

This object is also achieved with an amplifier arrangement, which comprises feedforward amplifying means which amplify a signal entering the arrangement, and adjusting means which use complex factors α and β, which are adapted in order to adjust the phase and amplitude of an input signal to the amplifier arrangement.

The amplifier arrangement of the invention is characterized in that it comprises attenuation means which attenuate the signal amplified by amplifying means, means which subtract the attenuated signal from the adapted signal, adjusting means which receive part of the signal entering the arrangement for adaptation by factor α, which is adapted partly by the signal obtained from the adapted signal, means which are connected to the outgoing end of the amplifier arrangement and form a predetermined signal, adders which add the predetermined signal to the signal amplified by the amplifier, means which form a conjugate signal of the adapted signal and multiply the conjugate signal by the predetermined signal and control adaptation of factor β with the signal obtained as a result of multiplication.

The dependent claims relate to preferred embodiments of the invention.

The invention is based on the idea that both factor α and factor β are formed using different adaptation methods.

The adaptation method and amplifier arrangement of the invention provide several advantages. The amplifier arrangement uses a pilot signal for adapting the factors. The pilot signal is used after the input signal of the amplifier arrangement has been amplified. Thanks to the method the pilot signal can be eliminated, and thus the pilot signal does not need to be filtered at the outgoing end of the amplifier arrangement. Furthermore, the method allows to render the errors of the signal cancellation loop and error cancellation loop independent of one another, and consequently the requirements for accuracy of the amplifier arrangement can be reduced. The amplifier arrangement is suitable for use in power amplifiers of base stations in radio systems. These include CDMA and multi-carrier radio systems.

BRIEF DESCRIPTION OF THE DRAWINGS

The invention will be described more closely by means of preferred embodiments with reference to the accompanying drawings, in which.

DETAILED DESCRIPTION OF THE INVENTION

Figure 1:
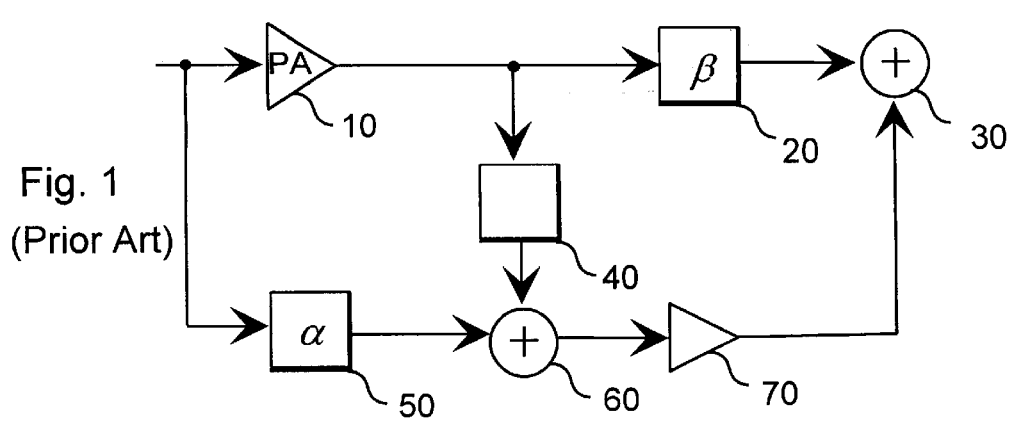
FIG. 1 illustrates a prior art amplifier arrangement.

FIG. 1 illustrates a prior art amplifier arrangement, which comprises a power amplifier 10, attenuation means 40, amplifier 70 and means 30, 60. In the figure the means 30, 60 function as subtracters. The amplifier arrangement also comprises adjusting means 20, 50. The adjusting means 50 form factor α. The adjusting means 20 form factor β. The outgoing end of the power amplifier 10 is usually in contact with the adjusting means 20 and attenuation means 40. The incoming end of the power amplifier 10 is in contact with the adjusting means 50. The incoming end of the amplifier 70 is in contact with the means 60. The outgoing end of the amplifier 70 and the outgoing end of the adjusting means 20 are in contact with the means 30.

The power amplifier 10, attenuation means 40 and adjusting means 50 form signal cancellation loop A. The adjusting means 20, amplifier 70 and attenuation means 40 form error cancellation loop B. The amplifier arrangement illustrated in the figure is of the feedforward type. In a feedforward amplifier the signal is not fed back to the incoming end of the power amplifier after amplification.

A signal entering the amplifier arrangement and containing information is first supplied to the incoming end of the power amplifier 10. In practice, the power amplifier amplifies the signal amplitude. A signal entering the incoming end of the power amplifier is also supplied to the adjusting means 50. During amplification the power amplifier causes for example distortion to the signal. The distorted signal is supplied to the attenuation means 40, which attenuate the signal. The distorted signal is also supplied to the adjusting means 20, which adapt the received signal with factor β. Thereafter the signal adapted by the adjusting means 20 is supplied to the means 30.

The adjusting means 50 adapt the received signal by factor α. After adaptation the signal is supplied to the means 60, which subtract the attenuated signal from the adapted signal. On the basis of the subtraction a distorted signal can be separated from an information signal entering the amplifier arrangement. The distorted signal is supplied to the amplifier 70, which amplifies the distorted signal. The amplified distorted signal is supplied further to the means 30, which subtract the distorted signal from the signal adapted by the adjusting means 20. After the signal is subtracted, we obtain an amplified signal which corresponds to the original information signal and contains no distortion. In prior art amplifier arrangements a pilot signal has been used for adapting the factors before amplifying the signal to be adapted with a power amplifier. For this reason, the amplifier arrangement has required a separate filter element at the outgoing end of the arrangement for filtering the pilot signal out of the output signal.

Figure 2:
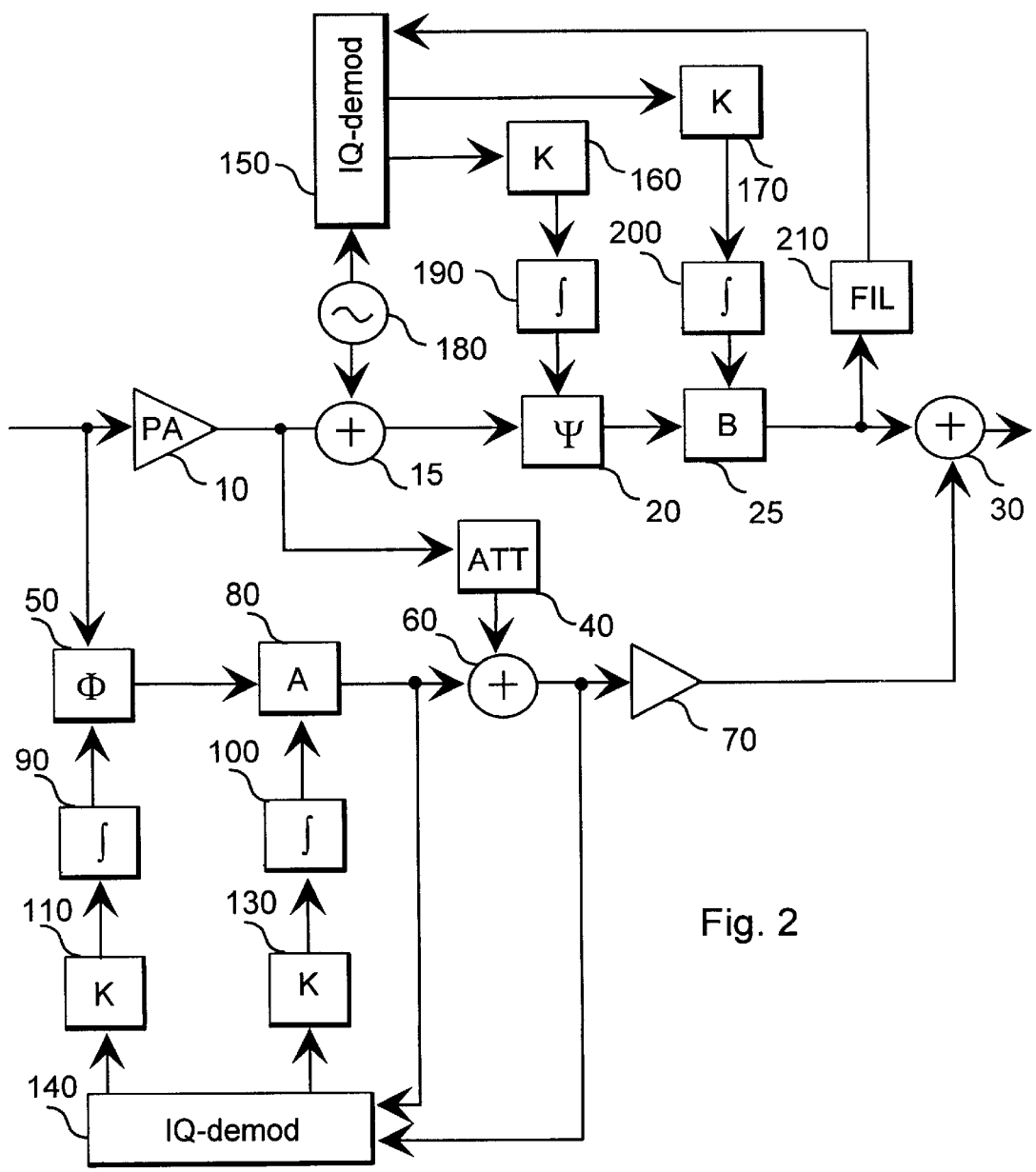
FIG. 2 illustrates an amplifier arrangement of the invention.

FIG. 2 illustrates an amplifier arrangement of the invention. The amplifier arrangement comprises amplifying means 10, which is in practice a power amplifier, adjusting means 20, 25, 50, 80, adder 15, means 30, 60, attenuation means 40 and amplifier 70. In the solution illustrated in the figure the means 30, 60 function as subtracters. The amplifier arrangement also comprises integration means 90, 100, 190, 200, adaptation means 110, 130, 160, 170, means 140, 150, filtering means 210 and means 180 which form a predetermined signal. The means 140, 150 are in practice quadrature demodulators.

The amplifier arrangement receives an input signal, which is supplied to the amplifying means 10 and adjusting means 50. The amplifying means 10 amplify the received signal, which is supplied to the adder 15 after amplification. Between the output of the amplifier 10 and the input of the adder 15 the amplified signal is supplied to the attenuation means 40, which attenuate the signal. The attenuated signal is supplied to the means 60.

The adjusting means 50 adapt the phase of the received signal so as to render it suitable for the amplifier arrangement. After the phase has been adapted, the signal is supplied to the adjusting means 80, which adapt the signal amplitude to the amplifier arrangement. After the adjusting means 50, 80 have adapted the signal, the adapted signal is supplied to the means 60, which subtract the signal attenuated by the attenuation means 40 from the adapted signal. The difference signal formed by the means 60 is supplied to the amplifier 70 for amplification. The signal amplified in the amplifier 70 is supplied to the means 30.

After the phase and amplitude have been adapted, part of the adapted signal is supplied to the means 140. Part of the difference signal formed by the means 60 is also supplied to the means 140. The means 140 control the adaptation means 110, 130 with signals formed from the signals they have received. The adaptation means 110, 130 form adaptation factors which are supplied to the adjusting means 50, 80 via the integration means 90, 100.

Even though polar variables, i.e. amplitude and phase, have been expressed as separate variables, they could be marked and treated as one variable by using complex manner of expression and by treating the variables as if they were vectors. This allows to define variable α as follows α=A+jΦ, and variable β as follows β=B+jΨ, where j is an imaginary unit. A and B represent the amplitude, and Φ and Ψ represent the phase.

The adaptation means 110, 130 form factor $\alpha_{n+1}$ for the input signal following the input signal of the amplifier according to the following formula (1):

$$\alpha_{n+1} = \alpha_n - K \nabla \qquad (1)$$

where $\alpha_n$ is the factor used in adapting a signal, $\alpha_{n+1}$ is the factor used in adapting the signal following the above-mentioned signal, K is the adaptation factor formed by the adaptation means 110, 130, $\nabla$ is the gradient.

The predetermined signal formed by the means 180 is added to the output signal of the power amplifier 10 in the adder 15. The sum signal formed in the adder is supplied to the adjusting means 25 via the adjusting means 20. The adjusting means 20 adapt the phase of the received signal to the amplifier arrangement. After the phase has been adapted, the signal is supplied to the adjusting means 25, which adapt the signal amplitude to the amplifier arrangement. After the phase and amplitude have been adapted, part of the adapted signal is supplied to the means 150 via the filtering means 210. The means 150 also receive the predetermined signal formed by the means 180. The predetermined signal formed by the means 180 is preferably a pilot signal.

The means 150 control the adaptation means 160, 170 on the basis of the signal they have received. The adaptation means 160, 170 form adaptation factors which are supplied to the adjusting means 20, 25 via the integration means 190, 200. Thus the adaptation factors are used for controlling the operation of the adjusting means 20, 25.

The adaptation means 160, 170 form factor $\beta_{n+1}$ for the signal following the input signal of the amplifier 10 according to the following formula (2):

$$\beta_{n+1} = \beta_n - K^* V_{pilot}^* \text{conj}(V_{out}) \qquad (2)$$

where $\beta_n$ is the factor used in adapting the signal, $\beta_{n+1}$ is the factor used in adapting the signal following the above-mentioned signal, K is the adaptation factor formed by the adaptation means 160, 170 $V_{pilot}$ is the pilot signal, $\text{conj}(V_{out})$ is the conjugate signal of signal $V_{out}$.

Even though the invention is described above with reference to an embodiment illustrated in the accompanying drawings, it is obvious that the invention is not restricted thereto but may be modified in several ways within the scope of the inventive idea disclosed in the appended claims.

What is claimed is:

1. An adaptation method used in an amplifier arrangement, the method comprising amplifying a signal entering the arrangement in a feedforward manner and using complex factors α and β, which are adapted in order to adjust the phase and amplitude of the input signal to the amplifier arrangement, characterized by adapting complex factor a by attenuating an amplified signal, by supplying part of a signal entering the arrangement for adaptation, and by controlling adaptation of complex factor α with part of the signal whose phase and amplitude are adapted, by subtracting the attenuated signal from the signal adapted by complex factor α, adapting complex factor β by forming a predetermined signal, which is added to the amplified signal, by forming a conjugate signal of the signal adapted by complex factor β and by multiplying it by the predetermined signal, by adapting factor β by the signal obtained as a result of multiplication, factor β being used for adapting the phase and amplitude of the formed sum signal.

2. A method according to claim 1, characterized in that the signal obtained as a result of subtraction is subtracted from the signal adapted by factor β.

3. A method according to claim 1, characterized in that the conjugate signal is multiplied by a suitable adaptation factor in addition to the predetermined signal.

4. A method according to claim 1, characterized in that the signal obtained as a result of subtraction is amplified before it is added.

5. A method according to claim 1, characterized in that part of the signal obtained as a result of subtraction is used for controlling adaptation of complex factor α.

6. A method according to claim 1, characterized in that multiplication prevents the predetermined signal from appearing in the signal adapted by factor β.

7. A method according to claim 1, characterized in that the predetermined signal is a pilot signal.

8. A method according to claim 1, characterized in that the signal adapted by factor α is subtracted from the attenuated signal.

9. A method according to claim 1, characterized in that the signal adapted by factor β is filtered before a conjugate signal is formed from the signal.

10. An amplifier arrangement, which comprises feedforward amplifying means (10) which amplify a signal entering the arrangement, and adjusting means (20, 25, 50, 80) which use complex factors α and β, which are adapted in order to adjust the phase and amplitude of the input signal to the amplifier arrangement, characterized in that the amplifier arrangement comprises attenuation means (40) which attenuate the signal amplified by the amplifier (10), subtracting means (60) which subtract the attenuated signal from the signal adapted by complex factor α, adjusting means (50, 80) which receive part of the signal entering the arrangement for adaptation by factor α, which is adapted partly by the signal obtained from the signal adapted by complex factor α, signal generating means (180) which are connected to the outgoing end of the amplifier (10) and form a predetermined signal, adders (15) which add the predetermined signal to the signal amplified by the amplifying means (10), demodulating means (150) which form a conjugate signal of the signal adapted by complex factor β and multiply the conjugate signal by the predetermined signal and control adaptation of factor β with the signal obtained as a result of multiplication.

11. An amplifier arrangement according to claim 10, characterized in that the demodulating means (150) eliminate the predetermined signal from the signal adapted by complex factor β.

12. An amplifier arrangement according to claim 10, characterized in that the predetermined signal is a pilot signal.

13. An amplifier arrangement according to claim 10, characterized in that the amplifier arrangement comprises subtracting means (60) which subtract the signal adapted by factor α from the attenuated signal.

14. An amplifier arrangement according to claim 10, characterized in that the amplifier arrangement comprises an amplifier (70) which amplifies the signal as a result of the subtraction performed by the subtraction means (60).

15. An amplifier arrangement according to claim 10, characterized in that the amplifier arrangement comprises an amplifier (70) which amplifies the signal obtained as a result of the subtraction performed by the subtracting means (60) and second subtracting means (30) for summation which are connected to the amplifier and add the signal amplified by the amplifier (70) to the signal adapted by factor β.

16. An amplifier arrangement according to claim 10, characterized in that the amplifier arrangement comprises second subtracting means (30) which subtract the signal adapted by factor a and the signal adapted by factor β from each other.

17. An amplifier arrangement according to claim 10, characterized in that the amplifier arrangement comprises filtering means (210) which receive part of the signal adapted by factor β and filter the received signal before supplying it to the demodulating means (150).

* * * * *